United States Patent
Matsuo et al.

(10) Patent No.: US 11,979,140 B2
(45) Date of Patent: May 7, 2024

(54) RECESS FRAME STRUCTURE FOR REDUCTION OF SPURIOUS SIGNALS IN A BULK ACOUSTIC WAVE RESONATOR

(71) Applicant: SKYWORKS GLOBAL PTE. LTD., Singapore (SG)

(72) Inventors: Nobufumi Matsuo, Suita (JP); Kwang Jae Shin, Yongin (KR)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 0 days.

(21) Appl. No.: 18/138,953

(22) Filed: Apr. 25, 2023

(65) Prior Publication Data
US 2023/0261637 A1    Aug. 17, 2023

Related U.S. Application Data

(62) Division of application No. 16/568,439, filed on Sep. 12, 2019, now Pat. No. 11,671,074.
(Continued)

(51) Int. Cl.
*H03H 9/17* (2006.01)
*H03H 3/02* (2006.01)
(Continued)

(52) U.S. Cl.
CPC .............. *H03H 9/173* (2013.01); *H03H 3/02* (2013.01); *H03H 9/0014* (2013.01);
(Continued)

(58) Field of Classification Search
CPC ........ H03H 9/173; H03H 3/02; H03H 9/0014; H03H 9/0211; H03H 9/13; H03H 9/564;
(Continued)

(56) References Cited

U.S. PATENT DOCUMENTS

| 7,358,831 B2 | 4/2008 | Larson et al. |
| 9,385,303 B2 | 7/2016 | Song et al. |

(Continued)

FOREIGN PATENT DOCUMENTS

| JP | 2002374144 A | 12/2002 |
| JP | 2007208845 A | 8/2007 |

(Continued)

OTHER PUBLICATIONS

Extended European Search Report from corresponding European Application No. 19197061.5 dated Dec. 10, 2019.

(Continued)

*Primary Examiner* — Edward Chin
(74) *Attorney, Agent, or Firm* — Lando & Anastasi, LLP (57) ABSTRACT

A method of forming a film bulk acoustic wave resonator comprises depositing a bottom electrode on an upper surface of a layer of dielectric material disposed over a cavity defined between the layer of dielectric material and a substrate, depositing a seed layer of piezoelectric material on an upper surface of the bottom electrode, etching one or more openings through the seed layer of piezoelectric material, etching of the one or more openings including over-etching of the seed layer in an amount sufficient to damage portions of the upper surface of the bottom electrode exposed by etching of the one or more openings, and depositing a bulk film of the piezoelectric material on an upper surface of the seed layer, on a portion of the upper surface of bottom electrode including the damaged portions, and on a portion of the upper surface of the dielectric layer.

23 Claims, 7 Drawing Sheets

Related U.S. Application Data (60) Provisional application No. 62/836,130, filed on Apr. 19, 2019, provisional application No. 62/730,128, filed on Sep. 12, 2018.

(51) Int. Cl.
  *H03H 9/00* (2006.01)
  *H03H 9/02* (2006.01)
  *H03H 9/13* (2006.01)
  *H03H 9/56* (2006.01)
  *H03H 9/70* (2006.01)

(52) U.S. Cl.
  CPC ............ *H03H 9/0211* (2013.01); *H03H 9/13* (2013.01); *H03H 9/564* (2013.01); *H03H 9/706* (2013.01); *H03H 2003/021* (2013.01)

(58) Field of Classification Search
  CPC ............ H03H 9/706; H03H 2003/021; H03H 9/02118; H03H 9/02015; H03H 9/02047; H03H 9/0514; H03H 9/1007; H03H 9/171
  See application file for complete search history.

(56) References Cited

U.S. PATENT DOCUMENTS

| | | | |
|---|---|---|---|
| 11,082,023 B2 | 8/2021 | Shin et al. | |
| 2007/0057599 A1 | 3/2007 | Motai et al. | |
| 2008/0024042 A1 | 1/2008 | Isobe et al. | |
| 2008/0174389 A1 | 7/2008 | Mori et al. | |
| 2009/0001848 A1 | 1/2009 | Umeda et al. | |
| 2010/0013573 A1 | 1/2010 | Umeda | |
| 2011/0180391 A1 | 7/2011 | Larson, III et al. | |
| 2011/0304412 A1 | 12/2011 | Zhang | |
| 2012/0200195 A1 | 8/2012 | Yokoyama et al. | |
| 2013/0033337 A1 | 2/2013 | Nishihara et al. | |
| 2013/0063227 A1 | 3/2013 | Burak et al. | |
| 2013/0106248 A1 | 5/2013 | Burak et al. | |
| 2013/0140959 A1* | 6/2013 | Shin ........................ | H03H 3/02 29/25.35 |
| 2013/0193809 A1 | 8/2013 | Araki | |
| 2014/0118091 A1 | 5/2014 | Burak et al. | |
| 2014/0118092 A1* | 5/2014 | Burak ..................... | H03H 9/175 333/187 |
| 2014/0167566 A1 | 6/2014 | Kando | |
| 2014/0203684 A1 | 7/2014 | Yamamoto et al. | |
| 2014/0203686 A1 | 7/2014 | Song et al. | |
| 2014/0292150 A1 | 10/2014 | Zou et al. | |
| 2014/0339959 A1* | 11/2014 | Lee ..................... | H10N 30/067 438/42 |
| 2015/0214923 A1 | 7/2015 | Tsuzuki | |
| 2016/0028371 A1 | 1/2016 | Nishihara et al. | |
| 2016/0118958 A1 | 4/2016 | Burak et al. | |
| 2016/0164487 A1 | 6/2016 | Shin et al. | |
| 2017/0033769 A1 | 2/2017 | Yokoyama | |
| 2017/0093374 A1 | 3/2017 | Yatsenko et al. | |
| 2017/0214388 A1 | 7/2017 | Irieda et al. | |
| 2017/0288121 A1 | 10/2017 | Burak et al. | |
| 2017/0288122 A1 | 10/2017 | Zou et al. | |
| 2018/0013401 A1 | 1/2018 | Lee et al. | |
| 2018/0048287 A1 | 2/2018 | Lee et al. | |
| 2018/0085787 A1 | 3/2018 | Burak et al. | |
| 2018/0115302 A1 | 4/2018 | Yeh et al. | |
| 2018/0219528 A1* | 8/2018 | Liu ........................ | H03H 9/131 |
| 2018/0254764 A1* | 9/2018 | Lee ........................ | H03H 9/174 |
| 2018/0278231 A1* | 9/2018 | Hurwitz ................. | H03H 9/588 |
| 2018/0309427 A1 | 10/2018 | Kim et al. | |
| 2018/0351533 A1* | 12/2018 | Lee .................... | H03H 9/02086 |
| 2019/0115901 A1 | 4/2019 | Takahashi et al. | |
| 2020/0083861 A1 | 3/2020 | Matsuo et al. | |
| 2020/0099359 A1 | 3/2020 | Shin et al. | |
| 2020/0119713 A1* | 4/2020 | Kim ........................ | H03H 9/131 |
| 2020/0168785 A1 | 5/2020 | Ikeuchi et al. | |
| 2020/0204148 A1* | 6/2020 | Kim .................... | H03H 9/02118 |
| 2020/0350888 A1 | 11/2020 | Moulard | |
| 2020/0366266 A1 | 11/2020 | Pollard et al. | |
| 2020/0366271 A1 | 11/2020 | Kim et al. | |
| 2020/0373901 A1 | 11/2020 | Liu et al. | |
| 2020/0373911 A1 | 11/2020 | Wang et al. | |
| 2021/0028765 A1 | 1/2021 | Wang et al. | |
| 2021/0083643 A1 | 3/2021 | Liu et al. | |
| 2022/0368312 A1 | 11/2022 | Wang et al. | |
| 2022/0393664 A1 | 12/2022 | Liu et al. | |
| 2023/0006642 A1 | 1/2023 | Liu et al. | |
| 2023/0109382 A1 | 4/2023 | Liu et al. | |
| 2023/0188115 A1 | 6/2023 | Hatano | |
| 2023/0299744 A1 | 9/2023 | Zhang et al. | |

FOREIGN PATENT DOCUMENTS

| | | |
|---|---|---|
| JP | 2007288645 A | 11/2007 |
| JP | 2014090414 A | 5/2014 |
| WO | 2006129532 A1 | 12/2006 |
| WO | 2007119556 A1 | 10/2007 |
| WO | 2008126473 A1 | 10/2008 |
| WO | 2019029912 A1 | 2/2019 |

OTHER PUBLICATIONS

Li et al., "Use of double-raised-border structure for quality factor enhancement of type II piston mode FBAR", Microsystem Technologies, Berlin, Germany, vol. 24, No. 7, May 2018, pp. 2991-2997.

* cited by examiner

RECESS FRAME STRUCTURE FOR REDUCTION OF SPURIOUS SIGNALS IN A BULK ACOUSTIC WAVE RESONATOR

CROSS-REFERENCE TO RELATED APPLICATIONS

This application claims priority under 35 U.S.C. § 121 as a division of U.S. patent application Ser. No. 16/568,439, titled "RECESS FRAME STRUCTURE FOR A BULK ACOUSTIC WAVE RESONATOR," filed Sep. 12, 2019, which claims priority under 35 U.S.C. § 119(e) to U.S. Provisional Patent Application Ser. No. 62/836,130, titled "RECESS FRAME STRUCTURE FOR A BULK ACOUSTIC WAVE RESONATOR," filed Apr. 19, 2019 and to U.S. Provisional Patent Application Ser. No. 62/730,128, titled "RECESS FRAME STRUCTURE FOR A BULK ACOUSTIC WAVE RESONATOR," filed Sep. 12, 2018, each of which being incorporated herein by reference in its entirety for all purposes.

BACKGROUND

Technical Field

Embodiments of this disclosure relate to acoustic wave devices and structures and methods of mitigating spurious signals in same.

DESCRIPTION OF RELATED TECHNOLOGY

Acoustic wave devices, for example, bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with an aspect disclosed herein, there is provided a film bulk acoustic wave resonator (FBAR). The FBAR comprises a piezoelectric film disposed in a central region defining a main active domain in which a main acoustic wave is generated during operation, and in recessed frame regions disposed laterally on opposite sides of the central region. The piezoelectric film disposed in the recessed frame regions includes a greater concentration of defects than a concentration of defects in the piezoelectric film disposed in the central region.

In some embodiments, the FBAR further comprises a top electrode disposed on a top surface of the piezoelectric film and a bottom electrode disposed on a bottom surface of the piezoelectric film, a vertical distance between the top electrode and the bottom electrode in the central region being greater than the vertical distance between the top electrode and the bottom electrode in the recessed frame regions. The FBAR may further comprise raised frame regions disposed laterally on opposite sides of the recessed frame regions from the central region, the piezoelectric film extending laterally through the recessed frame regions, a thickness of the top electrode in the raised frame regions being greater than a thickness of the top electrode in the central region. An acoustic velocity in the piezoelectric film in the recessed frame regions may differ from an acoustic velocity in the piezoelectric film in the raised frame regions. The difference in acoustic velocity in the recessed frame regions and raised frame regions may create an acoustic velocity discontinuity sufficient to prevent transverse acoustic waves travelling through the piezoelectric film outside of the central region from entering the central region.

In some embodiments, at least a portion of the piezoelectric film within the raised frame regions includes a greater concentration of defects than a concentration of defects in the piezoelectric film disposed in the central region. A portion of the piezoelectric film in the raised frame regions including the greater concentration of defects than the concentration of defects in the piezoelectric film disposed in the central region may contact the bottom electrode.

In some embodiments, a portion of the piezoelectric film in the recessed frame regions including the greater concentration of defects than the concentration of defects in the piezoelectric film disposed in the central region contacts the bottom electrode.

In some embodiments, the FBAR further comprises a layer of dielectric material conformally deposited on a top surface of the top electrode.

In some embodiments, upper surfaces of the bottom electrode in the recessed frame regions exhibit a greater degree of surface defects that the surface of the bottom electrode in the central region. Upper surfaces of the bottom electrode in the raised frame regions may exhibit a greater degree of surface defects that the surface of the bottom electrode in the central region.

In some embodiments, a radio frequency filter includes an FBAR as disclosed above. The radio frequency filter may be included in an electronics module. The electronics module may be included in an electronic device.

In accordance with another aspect, there is provided a method of forming a film bulk acoustic wave resonator (FBAR). The method comprises depositing a bottom electrode on an upper surface of a layer of dielectric material disposed over a cavity defined between the layer of dielectric material and a substrate, depositing a seed layer of piezoelectric material on an upper surface of the bottom electrode, etching one or more openings through the seed layer of piezoelectric material, etching of the one or more openings including over-etching of the seed layer in an amount sufficient to damage portions of the upper surface of the bottom electrode exposed by etching of the one or more openings, and depositing a bulk film of the piezoelectric material on an upper surface of the seed layer, on a portion of the upper surface of bottom electrode including the damaged portions, and on a portion of the upper surface of the dielectric layer.

In some embodiments, over-etching of the seed layer causes sufficient damage to the upper surface of the bottom electrode to cause regions of the bulk film of piezoelectric material deposited over the one or more openings to exhibit a higher concentration of defects than regions of the bulk film of piezoelectric material deposited over portions of the seed layer not including the one or more openings.

In some embodiments, the method further comprises depositing a layer of conductive material on an upper surface of the bulk film of the piezoelectric material to form a top electrode. Depositing the layer of conductive material may include depositing the layer of conductive material with a first thickness in a central region disposed between areas directly above the one or more openings in the seed layer and depositing the conductive material with a second thickness greater than the first thickness in areas on opposite sides of the areas directly above the one or more openings in the seed layer from the central region.

In some embodiments, the method further comprises conformally depositing a layer of dielectric material on an upper surface of the layer of conductive material.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators (FBARs) are a form of bulk acoustic wave resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A FBAR exhibits a frequency response to applied signals with a resonance peak determined by a thickness of the film of piezoelectric material. Ideally, the only acoustic wave that would be generated in a FBAR is a main acoustic wave that would travel through the film of piezoelectric material in a direction perpendicular to layers of conducting material forming the top and bottom electrodes. The piezoelectric material of a FBAR, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the FBAR from what is expected or from what is intended and are generally considered undesirable.

Figure 1:
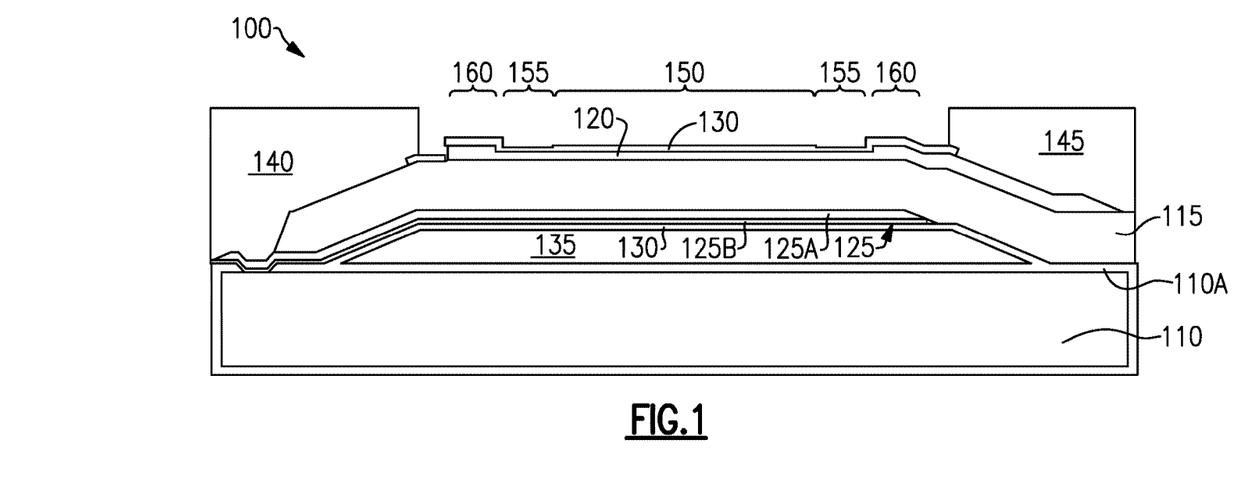
FIG. 1 is a cross-sectional view of an example of film bulk acoustic wave resonator.

FIG. 1 is cross-sectional view of an example of a FBAR, indicated generally at 100. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru). The bottom electrode 125 may include a layer 125A of Ru disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The FBAR 100 may include a central region 150 including a main active domain in the layer or film of piezoelectric material 115 in which a main acoustic wave is excited during operation. The central region may have a width of, for example, between about 20 μm and about 100 μm. A recessed frame region or regions 155 may bound and define the lateral extent of the central region 150. The recessed frame regions may have a width of, for example, about 1 μm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150 and/or the difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 µm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155.

The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

It has been recognized that the FBAR structure 100 illustrated in FIG. 1 may be improved upon. For example, during manufacturing it is sometimes difficult to precisely control etching of the layer of dielectric material 130 covering the top electrode 120 in the recessed frame region(s) 155. Manufacturing variability may result in different absolute or relative thicknesses between the layer of dielectric material 130 covering the top electrode 120 in the recessed frame region(s) 155 as compared with layer of dielectric material 130 covering the top electrode 120 in the central region across a wafer on which FBAR structures are formed, between different wafers in a batch, or between different production runs. The behavior of the FBAR structure 100 illustrated in FIG. 1 may thus undesirably vary from device to device.

Figure 2:
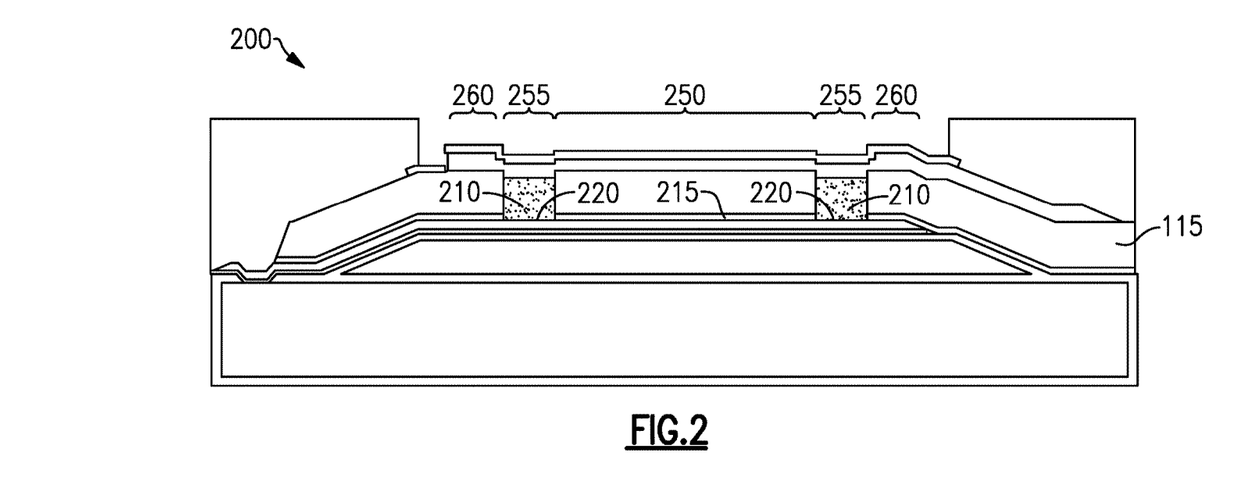
FIG. 2 is a cross-sectional view of another example of a film bulk acoustic wave resonator.

An improvement to the FBAR structure 100 of FIG. 1 that may both reduce manufacturing variability and increase the degree to which transverse acoustic waves and associated spurious signals are suppressed is illustrated in FIG. 2. The FBAR 200 of FIG. 2 is substantially the same as that of FIG. 1 and the common features are not numbered and are not described herein in detail. A difference between the FBAR structure 100 of FIG. 1 and the FBAR structure 200 of FIG. 2 is that in the FBAR structure 200 of FIG. 2, a region 210 of low-quality piezoelectric material 115 is intentionally formed in the recessed frame region(s) 255. The region 210 of low-quality piezoelectric material 115 may include a greater concentration of defects (e.g., voids, stacking faults, dislocations, misalignment of piezoelectric material crystals, etc. than the piezoelectric material 115 in the central region 250 and raised frame region(s) 260. In some embodiments, the region 210 of low quality piezoelectric material 115 may have surface roughness higher than other areas of the piezoelectric material 115 and/or a greater number or density of other forms of defects, for example, lattice vacancies, self-interstitial atoms, substitution or interstitial impurity atoms or other impurities, grain boundaries, alternate phases, inclusions, or mismatched crystallinity as compared to other areas of the piezoelectric material 115, for example, in the central region 250 and/or raised frame region(s) 260. The defects in the region 210 of low quality piezoelectric material 115 may create a greater degree of difference in acoustic impedance between the recessed frame region(s) 255 and raised frame region(s) 260 and/or central region 250 in the FBAR structure of FIG. 2 than between the corresponding recessed frame region(s) 155 and raised frame region(s) 160 and/or central region 150 in the FBAR structure 100 of FIG. 1. The increased difference in acoustic impedance between the different regions of the FBAR 200 of FIG. 2 may suppress or refract transverse acoustic waves to a greater extent than in the FBAR 100 of FIG. 1. The recessed frame region(s) 255 may also exhibit a higher acoustic velocity than the central region 250 and raised frame region(s) 260 due to the reduced overall film thickness in the recessed frame region(s) 255 as compared to the overall film thickness in the central region 250 and raised frame region(s) 260. As explained further below, a seed layer 215 of piezoelectric material 115 having open areas 220 into which the region 210 of low-quality piezoelectric material 115 extends may facilitate forming the region 210 of low-quality piezoelectric material 115.

Figure 3A:
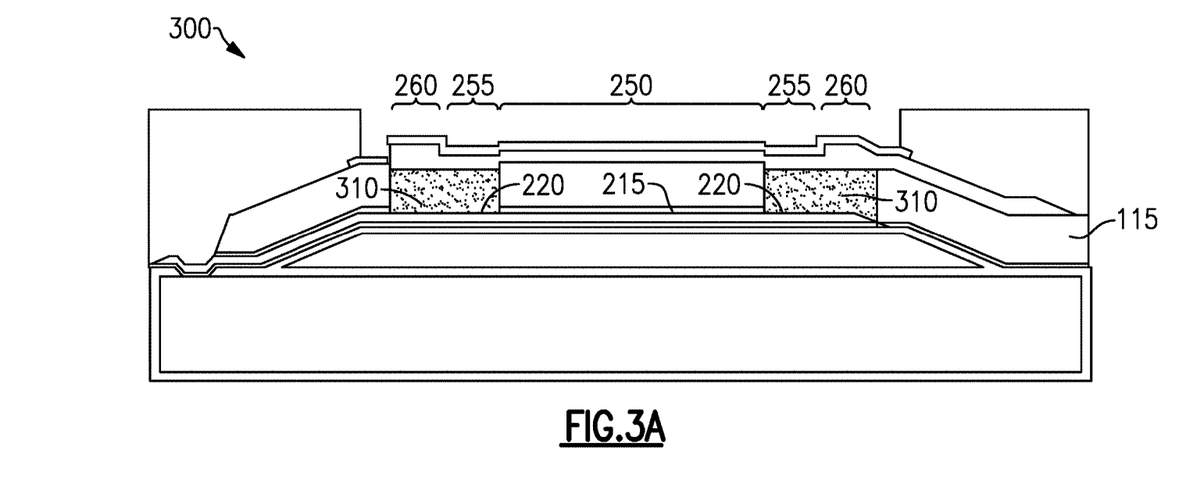
FIG. 3A is a cross-sectional view of another example of a film bulk acoustic wave resonator.

In another embodiment, illustrated in FIG. 3A, in an FBAR structure 300, a region 310 of low-quality piezoelectric material 115 similar to region 210 in FIG. 2 may extend into both the recessed frame region(s) 255 and partially or completely into the raised frame region(s) 260 on opposite sides of the central region 250.

Figure 3B:
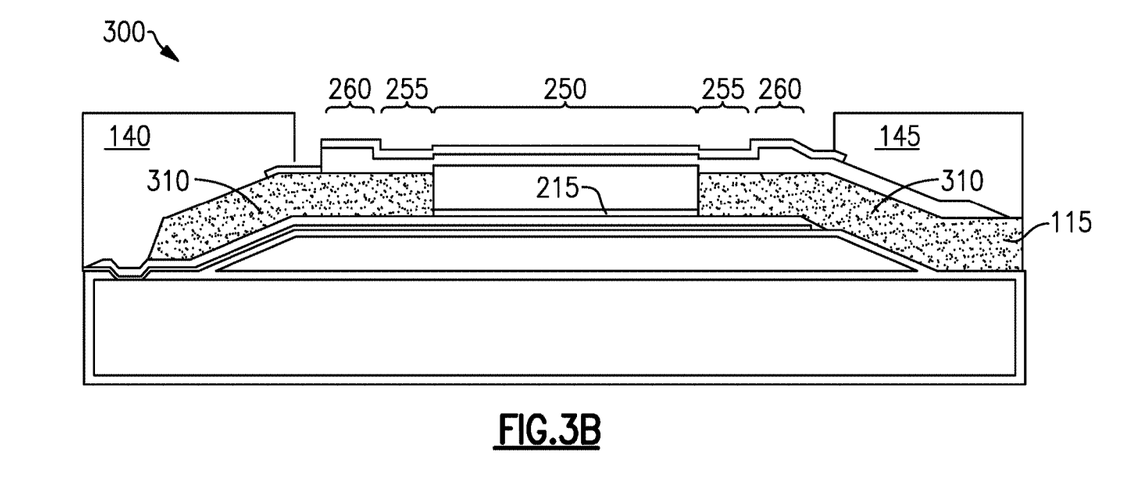
FIG. 3B is a cross-sectional view of another example of a film bulk acoustic wave resonator.

In a further embodiment, illustrated in FIG. 3B, in an FBAR structure 300, a region 310 of low quality piezoelectric material 115 similar to region 210 in FIG. 2 may extend into both the recessed frame region(s) 255 and past one or each of the raised frame region(s) 260 on opposite sides of the central region 250 and partially or completely into portions of the piezoelectric material 115 covered by the bottom electrical contact 140 and/or top electrical contact 145.

It should be appreciated that the FBARs illustrated in FIGS. 1-3B, are illustrated in a highly simplified form. The relative dimensions of the different features are not shown to scale. Further, typical FBARs may include additional features or layers not illustrated.

Figure 4:
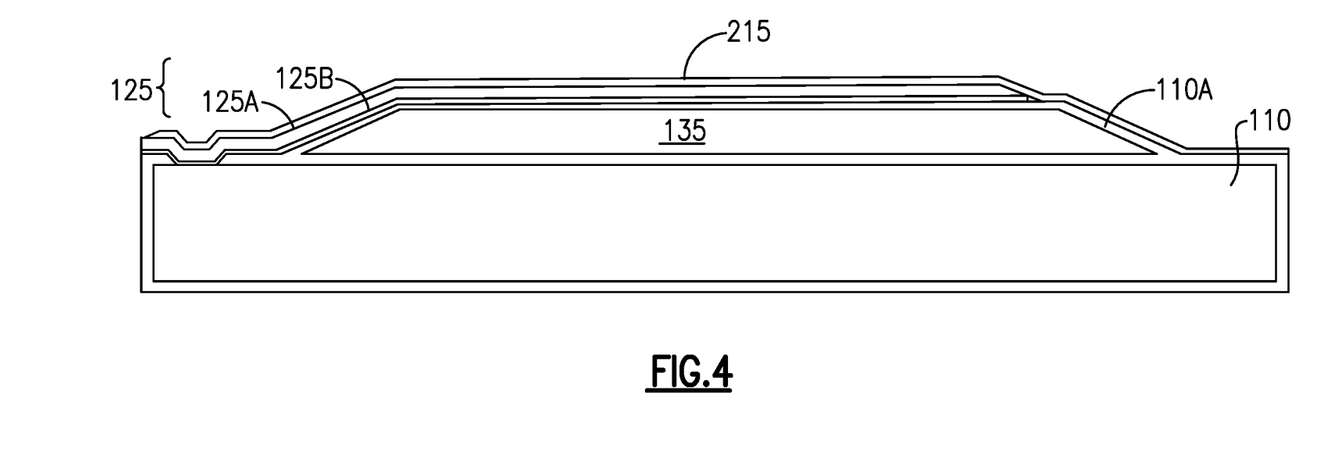
FIG. 4 illustrates an act in a method of forming an example of film bulk acoustic wave resonator.
Figure 5A:
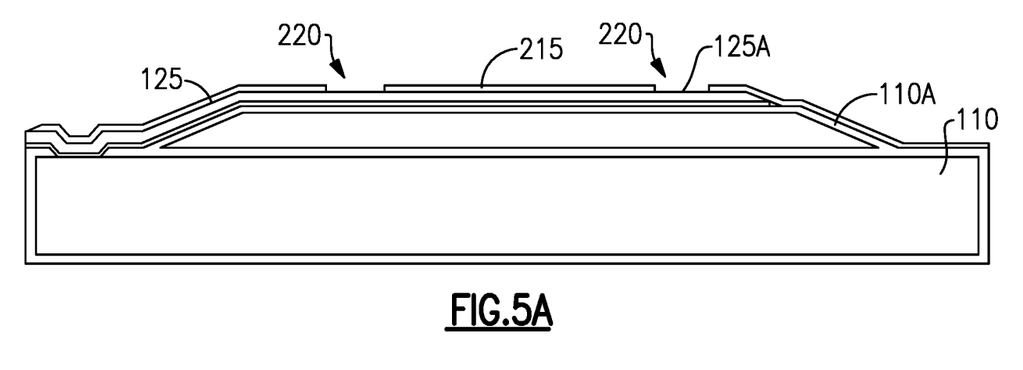
FIG. 5A illustrates another act in a method of forming an example of film bulk acoustic wave resonator.
Figure 5B:
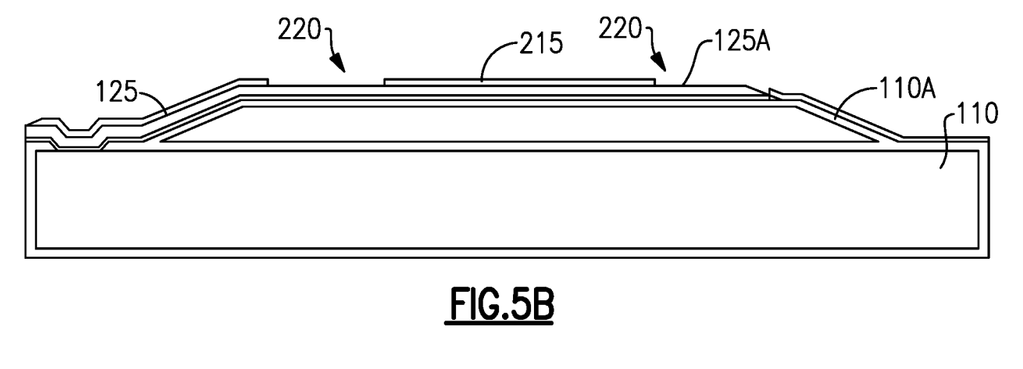
FIG. 5B illustrates another act in a method of forming an example of film bulk acoustic wave resonator.
Figure 5C:
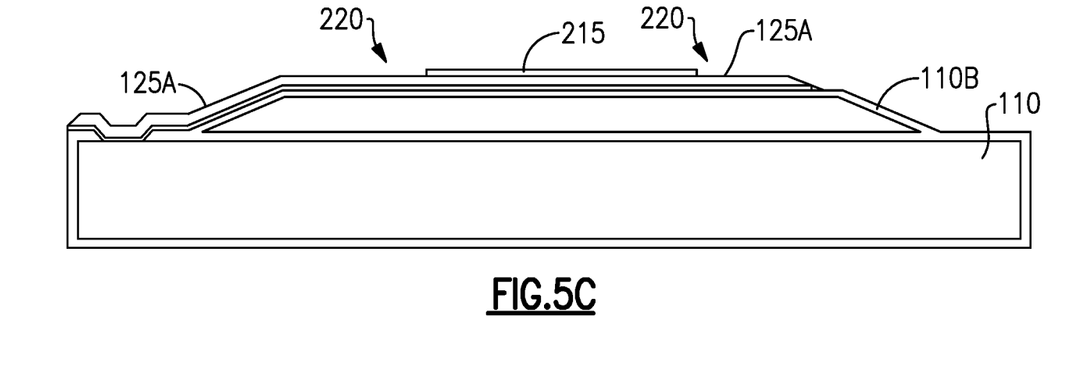
FIG. 5C illustrates another act in a method of forming an example of film bulk acoustic wave resonator.
Figure 6:
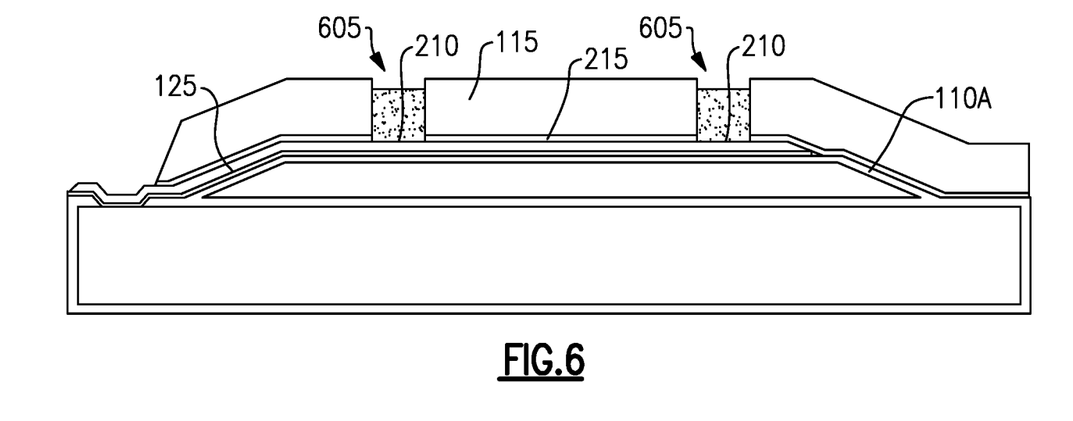
FIG. 6 illustrates another act in a method of forming an example of film bulk acoustic wave resonator.

Certain acts in forming embodiments of a FBAR structure including regions of low-quality piezoelectric material are illustrated in FIGS. 4-6. It should be appreciated that many other acts that are not illustrated, but that would be understood by one of ordinary skill in the art, may be involved in forming the completed FBAR structures.

In one act, illustrated in FIG. 4, a bottom electrode 125 is deposited on a layer of dielectric material 110A formed on a substrate 110 and defining a cavity 135. A seed layer 215 of piezoelectric material, for example, AN, is deposited directly on top of the bottom electrode 125 and the exposed portion of dielectric material 110A. The seed layer 215 may be deposited by, for example, chemical vapor deposition (CVD) or atomic layer deposition (ALD) which may provide for very precise control of the thickness of the seed layer 215.

After the seed layer 215 of piezoelectric material is deposited, open areas 220 are formed above which the regions of low-quality piezoelectric material will later be formed. The open areas may be positioned and dimensioned to correspond with the recessed frame region(s) 155 of the to-be-completed FBAR, as illustrated in FIG. 2 and in FIG. 5A (discussed further below) and/or to correspond with a portion or entirety of the raised frame regions(s) 160 of the to-be-completed FBAR, as illustrated in FIG. 3A and in FIG. 5B (discussed further below). In other embodiments, the seed layer 215 of piezoelectric material may be removed from all portions of the bottom electrode 215 and layer of dielectric material outside of the central region 250, as illustrated in FIG. 5C, to form a FBAR as illustrated in FIG. 3B. The seed layer 215 of piezoelectric material may be etched by dry etching, using, for example, a plasma or ion beam. Over-etching of the seed layer 215 may be performed, which results in damage, for example, surface roughness, pits, or other inhomogeneities in the upper surface of the portions of the bottom electrode 125 that become exposed during etching of the open areas 220 in the seed layer 215 of piezoelectric material.

After the open areas 220 are formed in the seed layer 215 of piezoelectric material or portions of the seed layer 215 are removed, the bulk of the film of piezoelectric material 115 is deposited over the seed layer 215 and portions of the bottom electrode 125 and the layer of dielectric material 110A. The bulk of the film of piezoelectric material may be deposited using a similar method as was used to deposit the seed layer 215, for example, CVD or ALD. The piezoelectric material deposited over the portions 125A of the bottom electrode 125 and/or dielectric layer 110B that were damaged by over-etching of the seed layer 215 may have a greater degree of defects and/or misaligned crystalline domains than in the piezoelectric material 115 deposited over the seed layer 215 and undamaged portions of the bottom electrode 215 and layer of dielectric material 110A. The piezoelectric material deposited over the portions of the bottom electrode 125 and/or dielectric material 110B that were damaged by over-etching of the seed layer 215 may thus include regions 210, 310 that exhibit lower quality than the piezoelectric material deposited over the seed layer 215 and undamaged portions of the bottom electrode 215 and layer of dielectric material 110A.

Upon completion of deposition of the bulk of the film of piezoelectric material, surfaces of the portions of the film of piezoelectric material that were deposited over the open areas 220 in the seed layer 215 (regions 210) or over portions of the bottom electrode 125 and/or layer of dielectric material 110A, 110B from which the seed layer 215 was removed may be recessed from surfaces of portions of the piezoelectric material deposited over the seed layer 215 and undamaged portions of the bottom electrode 215 and/or layer of dielectric material 110A. The depth of the recesses 605 (FIG. 6) may correspond to the thickness of the seed layer 215. As discussed above, the seed layer 215 may be deposited with a high degree of control over thickness. The depth of the recesses 605 may thus be more tightly controlled and less susceptible to manufacturing variability than recesses etched in the dielectric layer 130 in the recessed frame region(s) 155 in the FBAR structure 100 illustrated in FIG. 1.

To complete the FBAR structure, a layer (or layers) of electrode material may be deposited on top of the bulk of the film of piezoelectric material illustrated in FIG. 6, with thicker portions of the electrode material film being deposited in the raised frame region(s) 260. A conformal layer of dielectric material 130 may then be deposited over the electrode material film to result in the FBAR structure illustrated in FIG. 2, 3A or 3B.

Figure 7:
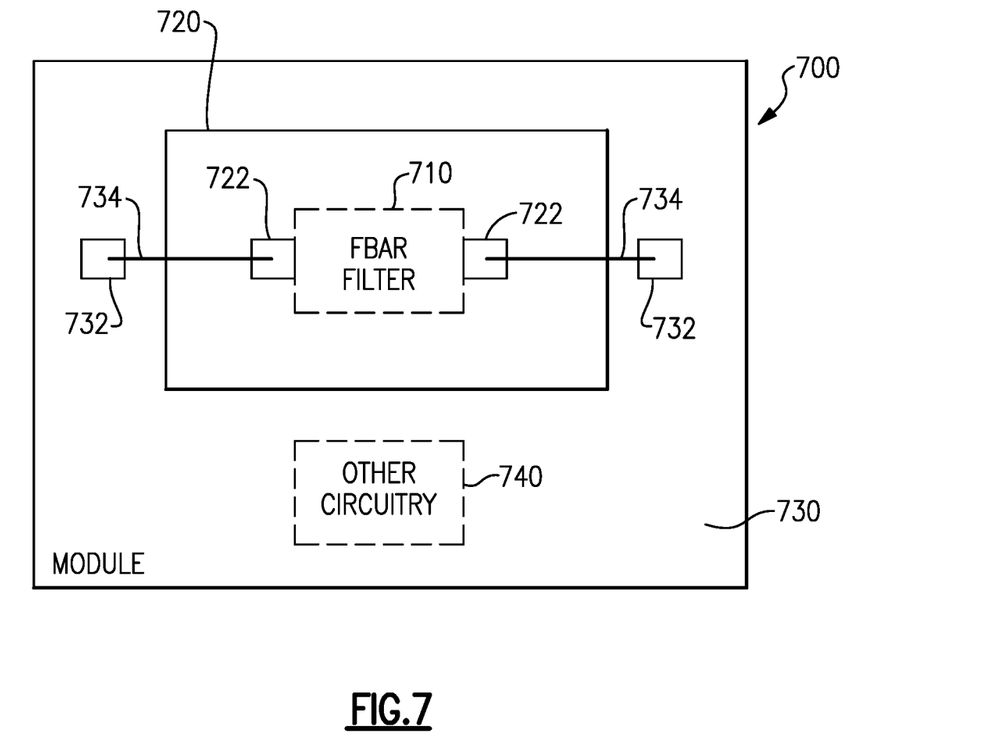
FIG. 7 is a block diagram of one example of a filter module that can include one or more acoustic wave elements according to aspects of the present disclosure.
Figure 8:
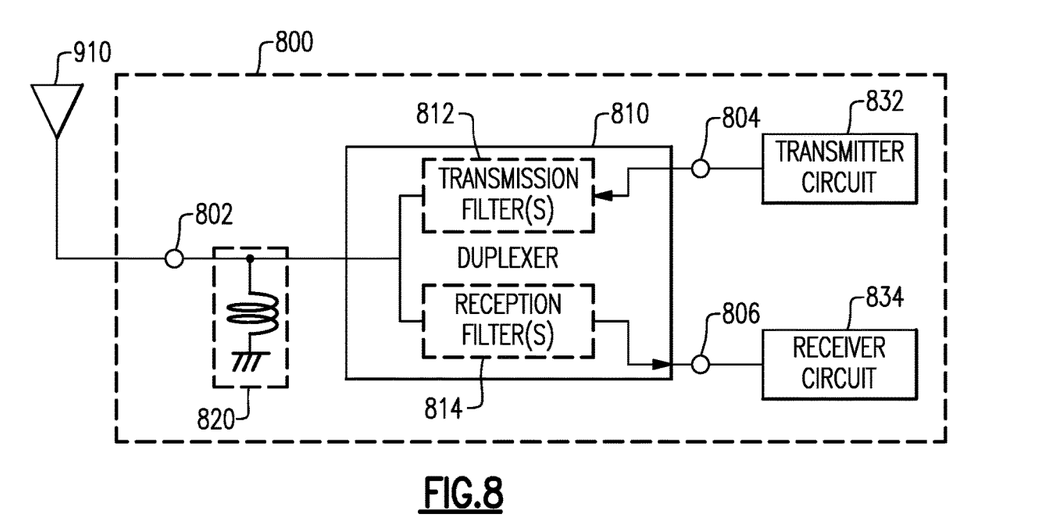
FIG. 8 is a block diagram of one example of a front-end module that can include one or more filter modules according to aspects of the present disclosure.
Figure 9:
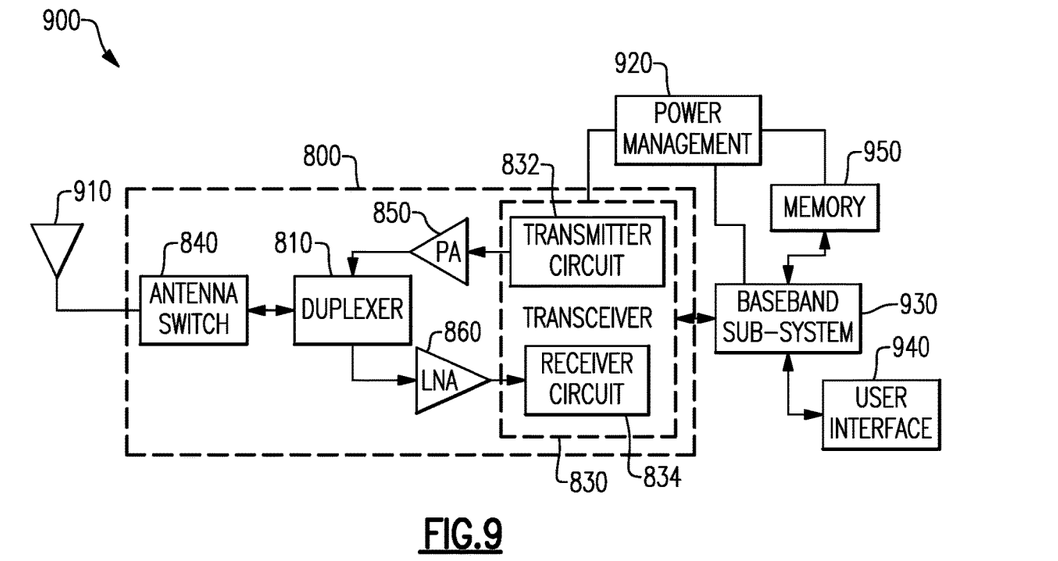
FIG. 9 is a block diagram of one example of a wireless device including the front-end module of FIG. 8.

The acoustic wave devices discussed herein can be implemented in a variety of packaged modules. Some example packaged modules will now be discussed in which any suitable principles and advantages of the packaged acoustic wave devices discussed herein can be implemented. FIGS. 7, 8, and 9 are schematic block diagrams of illustrative packaged modules and devices according to certain embodiments.

As discussed above, embodiments of the disclosed FBARs can be configured as or used in filters, for example. In turn, a FBAR filter using one or more FBAR elements may be incorporated into and packaged as a module that may ultimately be used in an electronic device, such as a wireless communications device, for example. FIG. 7 is a block diagram illustrating one example of a module 700 including a FBAR filter 710. The FBAR filter 710 may be implemented on one or more die(s) 720 including one or more connection pads 722. For example, the FBAR filter 710 may include a connection pad 722 that corresponds to an input contact for the FBAR filter and another connection pad 722 that corresponds to an output contact for the FBAR filter. The packaged module 700 includes a packaging substrate 730 that is configured to receive a plurality of components, including the die 720. A plurality of connection pads 732 can be disposed on the packaging substrate 730, and the various connection pads 722 of the FBAR filter die 720 can be connected to the connection pads 732 on the packaging substrate 730 via electrical connectors 734, which can be solder bumps or wirebonds, for example, to allow for passing of various signals to and from the FBAR filter 710. The module 700 may optionally further include other circuitry die 740, such as, for example one or more additional filter(s), amplifiers, pre-filters, modulators, demodulators, down converters, and the like, as would be known to one of skill in the art of semiconductor fabrication in view of the disclosure herein. In some embodiments, the module 700 can also include one or more packaging structures to, for example, provide protection and facilitate easier handling of the module 700. Such a packaging structure can include an overmold formed over the packaging substrate 730 and dimensioned to substantially encapsulate the various circuits and components thereon.

Various examples and embodiments of the FBAR filter 710 can be used in a wide variety of electronic devices. For example, the FBAR filter 710 can be used in an antenna duplexer, which itself can be incorporated into a variety of electronic devices, such as RF front-end modules and communication devices.

Referring to FIG. 8, there is illustrated a block diagram of one example of a front-end module 800, which may be used in an electronic device such as a wireless communications device (e.g., a mobile phone) for example. The front-end module 800 includes an antenna duplexer 810 having a common node 802, an input node 804, and an output node 806. An antenna 910 is connected to the common node 802.

The antenna duplexer 810 may include one or more transmission filters 812 connected between the input node 804 and the common node 802, and one or more reception filters 814 connected between the common node 802 and the output node 806. The passband(s) of the transmission filter(s) are different from the passband(s) of the reception filters. Examples of the FBAR filter 710 can be used to form the transmission filter(s) 812 and/or the reception filter(s)

814. An inductor or other matching component 820 may be connected at the common node 802.

The front-end module 800 further includes a transmitter circuit 832 connected to the input node 804 of the duplexer 810 and a receiver circuit 834 connected to the output node 806 of the duplexer 810. The transmitter circuit 832 can generate signals for transmission via the antenna 910, and the receiver circuit 834 can receive and process signals received via the antenna 910. In some embodiments, the receiver and transmitter circuits are implemented as separate components, as shown in FIG. 8, however in other embodiments these components may be integrated into a common transceiver circuit or module. As will be appreciated by those skilled in the art, the front-end module 800 may include other components that are not illustrated in FIG. 8 including, but not limited to, switches, electromagnetic couplers, amplifiers, processors, and the like.

FIG. 9 is a block diagram of one example of a wireless device 900 including the antenna duplexer 810 shown in FIG. 8. The wireless device 900 can be a cellular phone, smart phone, tablet, modem, communication network or any other portable or non-portable device configured for voice or data communication. The wireless device 900 can receive and transmit signals from the antenna 910. The wireless device includes an embodiment of a front-end module 800 similar to that discussed above with reference to FIG. 8. The front-end module 800 includes the duplexer 810, as discussed above. In the example shown in FIG. 9 the front-end module 800 further includes an antenna switch 840, which can be configured to switch between different frequency bands or modes, such as transmit and receive modes, for example. In the example illustrated in FIG. 9, the antenna switch 840 is positioned between the duplexer 810 and the antenna 910; however, in other examples the duplexer 810 can be positioned between the antenna switch 840 and the antenna 910. In other examples the antenna switch 840 and the duplexer 810 can be integrated into a single component.

The front-end module 800 includes a transceiver 830 that is configured to generate signals for transmission or to process received signals. The transceiver 830 can include the transmitter circuit 832, which can be connected to the input node 804 of the duplexer 810, and the receiver circuit 834, which can be connected to the output node 806 of the duplexer 810, as shown in the example of FIG. 8.

Signals generated for transmission by the transmitter circuit 832 are received by a power amplifier (PA) module 850, which amplifies the generated signals from the transceiver 830. The power amplifier module 850 can include one or more power amplifiers. The power amplifier module 850 can be used to amplify a wide variety of RF or other frequency-band transmission signals. For example, the power amplifier module 850 can receive an enable signal that can be used to pulse the output of the power amplifier to aid in transmitting a wireless local area network (WLAN) signal or any other suitable pulsed signal. The power amplifier module 850 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 850 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 9, the front-end module 800 may further include a low noise amplifier module 860, which amplifies received signals from the antenna 910 and provides the amplified signals to the receiver circuit 834 of the transceiver 830.

The wireless device 900 of FIG. 9 further includes a power management sub-system 920 that is connected to the transceiver 830 and manages the power for the operation of the wireless device 900. The power management system 920 can also control the operation of a baseband sub-system 930 and various other components of the wireless device 900. The power management system 920 can include, or can be connected to, a battery (not shown) that supplies power for the various components of the wireless device 900. The power management system 920 can further include one or more processors or controllers that can control the transmission of signals, for example. In one embodiment, the baseband sub-system 930 is connected to a user interface 940 to facilitate various input and output of voice and/or data provided to and received from the user. The baseband sub-system 930 can also be connected to memory 950 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of forming a film bulk acoustic wave resonator, the method comprising:
    depositing a bottom electrode on an upper surface of a layer of dielectric material disposed over a cavity defined between the layer of dielectric material and a substrate in a central region of the film bulk acoustic wave resonator defining a main active domain in which a main acoustic wave is generated during operation of the film bulk acoustic wave resonator, and in recessed frame regions disposed laterally on opposite sides of the central region;
    depositing a seed layer of piezoelectric material on an upper surface of the bottom electrode;
    etching one or more openings through the seed layer of piezoelectric material, the etching of the one or more openings including over-etching of the seed layer in an amount sufficient to damage portions of the upper surface of the bottom electrode exposed by etching of the one or more openings, etching the one or more openings through the seed layer of piezoelectric material creating a greater degree of surface defects on the upper surface of the bottom electrode in the recessed frame regions than on the upper surface of the bottom electrode in the central region; and
    depositing a bulk film of the piezoelectric material on an upper surface of the seed layer, on a portion of the upper surface of bottom electrode including the damaged portions, and on a portion of the upper surface of the layer of dielectric material.

2. The method of claim 1 wherein over-etching of the seed layer causes sufficient damage to the upper surface of the bottom electrode to cause regions of the bulk film of the piezoelectric material deposited over the one or more openings to exhibit a higher concentration of defects than regions of the bulk film of the piezoelectric material deposited over portions of the seed layer not including the one or more openings.

3. The method of claim 1 further comprising depositing a layer of conductive material on an upper surface of the bulk film of the piezoelectric material to form a top electrode.

4. The method of claim 3 wherein depositing the layer of conductive material includes depositing the layer of conductive material with a first thickness in a central region disposed between areas directly above the one or more openings in the seed layer and depositing the conductive material with a second thickness greater than the first thickness in areas on opposite sides of the areas directly above the one or more openings in the seed layer from the central region.

5. The method of claim 3 further comprising conformally depositing a second layer of dielectric material on an upper surface of the layer of conductive material.

6. The method of claim 3 wherein depositing the layer of conductive material includes depositing the layer of conductive material with a vertical distance between the top electrode and the bottom electrode in the central region being greater than the vertical distance between the top electrode and the bottom electrode in the recessed frame regions.

7. The method of claim 1 further comprising forming raised frame regions disposed laterally on opposite sides of the recessed frame regions from the central region, the bulk film of the piezoelectric material extending laterally through the raised frame regions.

8. The method of claim 7 wherein the one or more openings are etched in the recessed frame regions.

9. The method of claim 8 wherein the one or more openings are not etched in the raised frame regions.

10. The method of claim 8 further comprising depositing the bulk film of the piezoelectric material in the raised frame regions with a lower concentration of defects than a concentration of defects in the bulk film of the piezoelectric material deposited in the recessed frame regions.

11. The method of claim 8 further comprising depositing the bulk film of the piezoelectric material in the recessed frame regions with a greater concentration of defects than a concentration of defects in the bulk film of the piezoelectric material disposed in the central region.

12. The method of claim 8 wherein the one or more openings are etched in the recessed frame regions and in the raised frame regions.

13. The method of claim 12 further comprising depositing the bulk film of the piezoelectric material in the raised frame regions with a greater concentration of defects than a concentration of defects in the bulk film of the piezoelectric material disposed in the central region.

14. The method of claim 12 further comprising depositing the bulk film of the piezoelectric material in the raised frame regions in contact with the lower electrode.

15. The method of claim 12 wherein etching the one or more openings through the seed layer of piezoelectric material includes creating a greater degree of surface defects on the surface of the bottom electrode in the raised frame regions than on the surface of the bottom electrode in the central region.

16. The method of claim 1 further comprising depositing the bulk film of the piezoelectric material in the recessed frame regions in contact with the lower electrode.

17. The method of claim 1 further comprising forming a radio frequency filter including the film bulk acoustic wave resonator.

18. The method of claim 17 further comprising forming an electronics module including the radio frequency filter.

19. The method of claim 18 further comprising forming an electronic device including the electronics module.

20. A method of forming a film bulk acoustic wave resonator, the method comprising:
depositing a bottom electrode on an upper surface of a layer of dielectric material disposed over a cavity defined between the layer of dielectric material and a substrate in a central region of the film bulk acoustic wave resonator defining a main active domain in which a main acoustic wave is generated during operation of the film bulk acoustic wave resonator, and in recessed frame regions disposed laterally on opposite sides of the central region;
depositing a seed layer of piezoelectric material on an upper surface of the bottom electrode;
etching one or more openings through the seed layer of piezoelectric material, the etching of the one or more openings including over-etching of the seed layer in an amount sufficient to damage portions of the upper surface of the bottom electrode exposed by etching of the one or more openings;
depositing a bulk film of the piezoelectric material on an upper surface of the seed layer, on a portion of the upper surface of bottom electrode including the damaged portions, and on a portion of the upper surface of the layer of dielectric material; and
depositing a layer of conductive material on an upper surface of the bulk film of the piezoelectric material to form a top electrode including depositing the layer of conductive material with a first thickness in a central region disposed between areas directly above the one or more openings in the seed layer and depositing the conductive material with a second thickness greater than the first thickness in areas on opposite sides of the areas directly above the one or more openings in the seed layer from the central region.

21. A method of forming a film bulk acoustic wave resonator, the method comprising:
depositing a bottom electrode on an upper surface of a layer of dielectric material disposed over a cavity defined between the layer of dielectric material and a substrate in a central region of the film bulk acoustic wave resonator defining a main active domain in which a main acoustic wave is generated during operation of the film bulk acoustic wave resonator, and in recessed frame regions disposed laterally on opposite sides of the central region;
depositing a seed layer of piezoelectric material on an upper surface of the bottom electrode;
etching one or more openings through the seed layer of piezoelectric material, the etching of the one or more openings including over-etching of the seed layer in an amount sufficient to damage portions of the upper surface of the bottom electrode exposed by etching of the one or more openings;
depositing a bulk film of the piezoelectric material on an upper surface of the seed layer, on a portion of the upper surface of bottom electrode including the damaged portions, and on a portion of the upper surface of the layer of dielectric material; and
depositing a layer of conductive material on an upper surface of the bulk film of the piezoelectric material to form a top electrode including depositing the layer of conductive material with a vertical distance between the top electrode and the bottom electrode in the central region being greater than the vertical distance between the top electrode and the bottom electrode in the recessed frame regions.

22. A method of forming a film bulk acoustic wave resonator, the method comprising:
depositing a bottom electrode on an upper surface of a layer of dielectric material disposed over a cavity defined between the layer of dielectric material and a substrate in a central region of the film bulk acoustic wave resonator defining a main active domain in which a main acoustic wave is generated during operation of the film bulk acoustic wave resonator, and in recessed frame regions disposed laterally on opposite sides of the central region;
depositing a seed layer of piezoelectric material on an upper surface of the bottom electrode;
etching one or more openings through the seed layer of piezoelectric material in the recessed frame regions, the etching of the one or more openings including over-etching of the seed layer in an amount sufficient to damage portions of the upper surface of the bottom electrode exposed by etching of the one or more openings;
depositing a bulk film of the piezoelectric material on an upper surface of the seed layer, on a portion of the upper surface of bottom electrode including the damaged portions, and on a portion of the upper surface of the layer of dielectric material, the bulk film of the piezoelectric material being deposited in the recessed frame regions with a greater concentration of defects than a concentration of defects in the bulk film of the piezoelectric material disposed in the central region; and
forming raised frame regions disposed laterally on opposite sides of the recessed frame regions from the central region, the bulk film of the piezoelectric material extending laterally through the raised frame regions.

23. A method of forming a film bulk acoustic wave resonator, the method comprising:
depositing a bottom electrode on an upper surface of a layer of dielectric material disposed over a cavity defined between the layer of dielectric material and a substrate in a central region of the film bulk acoustic wave resonator defining a main active domain in which a main acoustic wave is generated during operation of the film bulk acoustic wave resonator, and in recessed frame regions disposed laterally on opposite sides of the central region;
depositing a seed layer of piezoelectric material on an upper surface of the bottom electrode;

etching one or more openings through the seed layer of piezoelectric material, the etching of the one or more openings including over-etching of the seed layer in an amount sufficient to damage portions of the upper surface of the bottom electrode exposed by etching of the one or more openings;

depositing a bulk film of the piezoelectric material on an upper surface of the seed layer, on a portion of the upper surface of bottom electrode including the damaged portions, and on a portion of the upper surface of the layer of dielectric material, the bulk film of the piezoelectric material being deposited in the recessed frame regions with a greater concentration of defects than a concentration of defects in the bulk film of the piezoelectric material disposed in the central region; and forming raised frame regions disposed laterally on opposite sides of the recessed frame regions from the central region, the bulk film of the piezoelectric material extending laterally through the raised frame regions, the one or more openings being etched in the recessed frame regions and in the raised frame regions.

* * * * *

UNITED STATES PATENT AND TRADEMARK OFFICE
CERTIFICATE OF CORRECTION

PATENT NO. : 11,979,140 B2
APPLICATION NO. : 18/138953
DATED : May 7, 2024
INVENTOR(S) : Nobufumi Matsuo et al.

It is certified that error appears in the above-identified patent and that said Letters Patent is hereby corrected as shown below:

In the Specification

Column 6, Line 61, delete "AN" and insert -- AlN --

Column 7, Line 14, delete "FB AR" and insert -- FBAR --

Signed and Sealed this
Fourth Day of June, 2024

Katherine Kelly Vidal
*Director of the United States Patent and Trademark Office*